(12) United States Patent
Lee et al.

(10) Patent No.: US 9,275,820 B2
(45) Date of Patent: Mar. 1, 2016

(54) GAS COUPLED ARC CHAMBER COOLING

(71) Applicant: Varian Semiconductor Equipment Associates, Inc., Gloucester, MA (US)

(72) Inventors: William Davis Lee, Newburport, MA (US); Neil J. Bassom, Hamilton, MA (US); Dennis Klesel, Sundown, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 131 days.

(21) Appl. No.: 14/011,047

(22) Filed: Aug. 27, 2013

(65) Prior Publication Data

US 2015/0061490 A1    Mar. 5, 2015

(51) Int. Cl.
  *H01J 7/44*      (2006.01)
  *H01J 27/02*     (2006.01)
  *H01J 37/08*     (2006.01)
  *H01J 37/317*    (2006.01)

(52) U.S. Cl.
  CPC .............. *H01J 27/022* (2013.01); *H01J 37/08* (2013.01); *H01J 37/3171* (2013.01); *H01J 2237/002* (2013.01); *H01J 2237/0825* (2013.01); *H01J 2237/30472* (2013.01)

(58) Field of Classification Search
  None
  See application file for complete search history.

(56) References Cited

U.S. PATENT DOCUMENTS

| | | | | | |
|---|---|---|---|---|---|
| 4,578,589 | A | * | 3/1986 | Aitken | H01J 37/3171 250/281 |
| 4,743,767 | A | * | 5/1988 | Plumb | H01J 27/022 250/398 |
| 4,847,504 | A | * | 7/1989 | Aitken | H01J 27/022 250/423 R |
| 5,070,510 | A | * | 12/1991 | Konushi | H01L 33/0062 257/E21.123 |
| 6,362,946 | B1 | | 3/2002 | Larsen | |
| 2002/0130278 | A1 | * | 9/2002 | Vella | H01J 37/08 250/492.21 |
| 2007/0178678 | A1 | * | 8/2007 | Hatem | C23C 14/48 438/513 |
| 2007/0178679 | A1 | * | 8/2007 | Hatem | C23C 14/48 438/514 |
| 2009/0183679 | A1 | * | 7/2009 | McIntyre | H01J 37/08 118/723 CB |
| 2011/0240877 | A1 | * | 10/2011 | Benveniste | H01J 37/08 250/424 |
| 2011/0240878 | A1 | * | 10/2011 | Benveniste | H01J 37/08 250/424 |
| 2012/0252195 | A1 | * | 10/2012 | Jones | H01J 37/08 438/514 |
| 2014/0099782 | A1 | * | 4/2014 | Bassom | F28D 15/04 438/514 |
| 2014/0292189 | A1 | * | 10/2014 | Aramaki | H01J 37/08 315/1 |

OTHER PUBLICATIONS

Bassom, Neil J., Method and Apparatus for Thermal Control of Ion Sources and Sputtering Targets, U.S. Appl. No. 13/645,006, filed Oct. 4, 2012.

* cited by examiner

*Primary Examiner* — Tung X Le
*Assistant Examiner* — Srinivas Sathiraju (57) ABSTRACT

An ion implantation system, having a temperature controlled ion source chamber is disclosed. The temperature of the ion source chamber is regulated by disposing a heat sink in proximity to the ion source chamber. A gas fillable chamber is disposed between and in physical communication with both the ion source chamber and the heat sink. By controlling the amount of gas, i.e. the gas pressure, within the gas fillable chamber, the coefficient of heat transfer can be manipulated. This allows the temperature of the ion source chamber to be controlled through the application or removal of gas from the gas fillable chamber. This independent temperature control decouples the power used to heat the ion generator from the ion species that are ultimately generated.

18 Claims, 7 Drawing Sheets

GAS COUPLED ARC CHAMBER COOLING

Embodiments of the present disclosure relate to a method and apparatus for controlling the temperature of an ion source chamber in an ion implantation system.

BACKGROUND

Ion implantation is a process by which dopants or impurities are introduced into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile is often important for proper IC performance. To achieve a desired doping profile, one or more dopants may be implanted in the form of ions in various doses and various energy levels.

Figure 1:
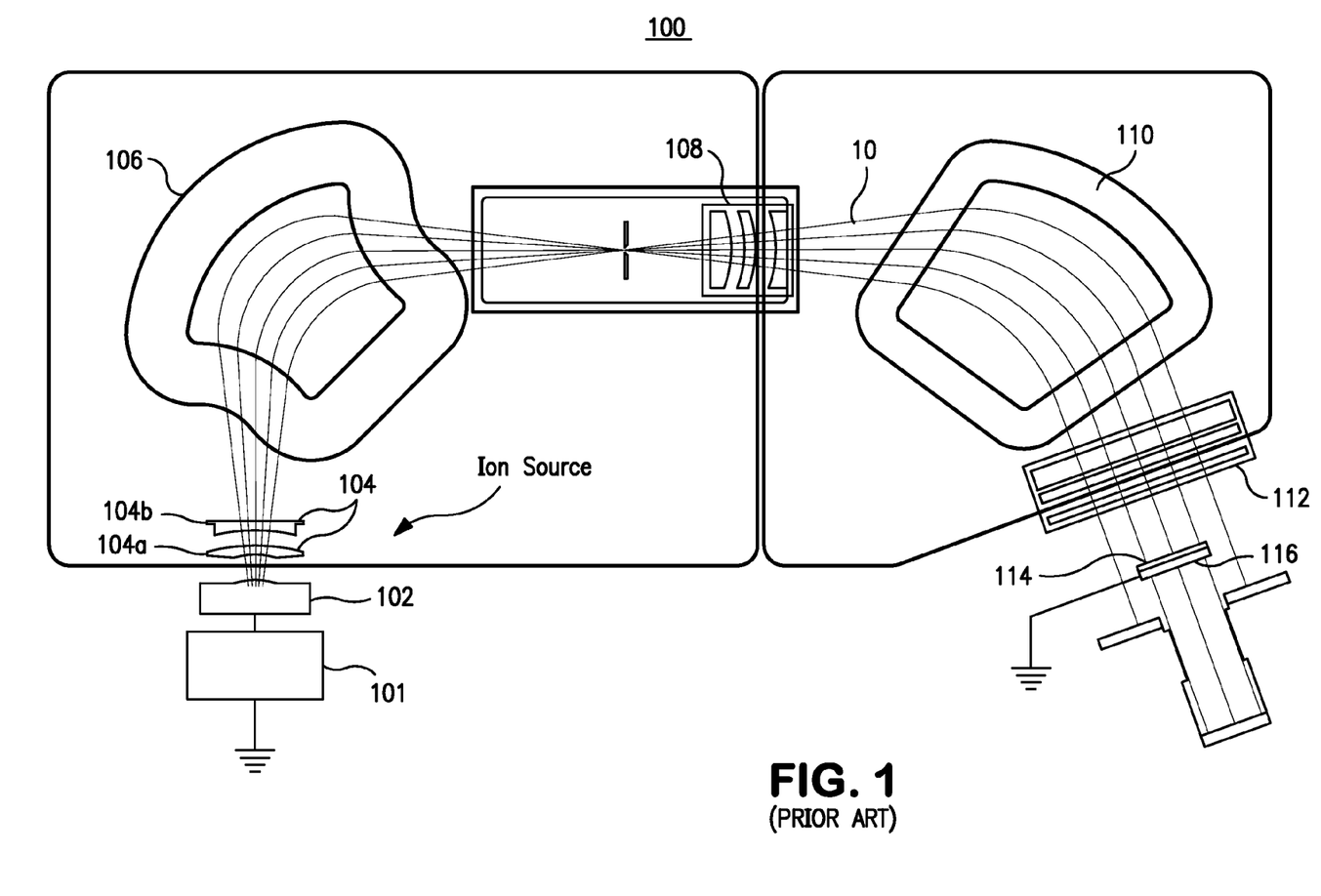
FIG. 1 is an ion implantation system in accordance with the prior art.

Referring to FIG. 1, there is shown a conventional ion implantation system 100. As illustrated in the figure, the ion implantation system 100 may comprise an ion source and a complex series of beam-line components through which an ion beam 10 passes. The ion source may comprise an ion source chamber 102 where desired ions are generated. The ion source may also comprise a power source 101 and an extraction electrode 104 disposed near the ion source chamber 102. As illustrated in the figure, the extraction electrodes 104 may include a suppression electrode 104a and a ground electrode 104b. Each of the ion source chamber 102, the suppression electrode 104a, and the ground electrode 104b may include an aperture: the ion source chamber 102 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 102 may pass through, toward the beam-line components.

The beam-line components, meanwhile, may include, for example, a mass analyzer 106, a first acceleration or deceleration (A1 or D1) stage 108, a collimator 110, and a second acceleration or deceleration (A2 or D2) stage 112. Much like a series of optical lenses that manipulate a light beam, the beam-line components can filter, focus, and manipulate ions or ion beam 10 having desired species, shape, energy, and other qualities. The ion beam 10 that passes through the beam-line components may be directed toward a substrate 114 that is mounted on a platen 116 or clamp. The substrate 114 may be moved in one or more dimensions (e.g., translate, rotate, and tilt) by an apparatus, sometimes referred to as a "roplat." It should be appreciated by those skilled in the art that the entire path traversed by the ion beam 10 is typically evacuated during ion implantation.

The ion source included in the ion implanter system 10 may be an indirectly heated cathode (IHC) source. In an IHC system, a cathode and a repeller electrode (or anti-cathode) may be positioned in the opposite sides of the ion source chamber 102. A filament may be positioned outside the ion source chamber 102 and in close proximity to the cathode in order to heat the cathode.

The ion source is required to generate a stable, well-defined ion beam 10 for a variety of different ion species and extraction voltages. In some embodiments, the temperature of the ion source, and particularly the temperature of the ion source chamber 102, is important in determining the types of ions that are created and extracted. For example, when boron trifluorine ($BF_3$) is used as a source or feed gas, it may become various ions, such as $BF_2^+$, $BF^+$, or $B^+$. It is the temperature within the ion source chamber 102 that is one of the factors in determining which of these ions is created. Larger molecular ions, such as $BF_2^+$ are more likely created at lower temperatures, while atomic ions, like $B^+$ are more likely created at higher temperatures. Typically, the temperature of the ion source chamber 102 is either not regulated, or is controlled by varying or regulating the amount of energy or power that is passed through the filament and used to heat the cathode.

Higher levels of power may result in mono-atomic ions. Lower levels of power may result in larger or molecular ions. However, lower levels of energy also tend to decrease the amount of ions that are generated, thereby lowering the available beam current. For this reason, implants that require larger or molecular ions may take more time to process than those with smaller or atomic ions. In other words, power, which is responsible for determining beam current, can also be used to determine the ion species that are to be created.

It would therefore be desirable to operate the ion source chamber such that the ion beam current and the ion species that are generated could be independently controlled. It would also be beneficial if larger or molecular ions could be generated at higher powers and thus with greater ion beam currents.

SUMMARY

An ion implantation system, having a temperature controlled ion source chamber is disclosed. The temperature of the ion source chamber is regulated by disposing a heat sink in proximity to the ion source chamber. A gas fillable chamber is disposed between and in physical communication with both the ion source chamber and the heat sink. By controlling the amount of gas, i.e. the gas pressure, within the gas fillable chamber, the coefficient of heat transfer can be manipulated. This allows the temperature of the ion source chamber to be controlled through the application or removal of gas from the gas fillable chamber. This independent temperature control decouples the power used to heat the ion generator from the ion species that are ultimately generated.

According to one embodiment, a method of producing an ion beam having a desired beam current and a desired ion composition is disclosed. The method comprises introducing a feed gas to an ion source chamber; applying power to an ion generator disposed in the ion source chamber to create a plasma having the desired beam current; and independently controlling a temperature of the ion source chamber by transferring a variable amount of heat away from the ion source chamber to create the ion beam of the desired ion composition.

According to a second embodiment, an ion source is disclosed, comprising an ion generator disposed within an ion source chamber for the generation of ions; a temperature regulator in thermal communication with the ion source chamber to regulate a temperature of the ion source chamber by transferring a variable amount of heat away from the ion source chamber; and a controller in communication with the temperature regulator and the ion source chamber, so as to control power applied to the ion generator in the ion source chamber and the temperature of the ion source chamber, based on a desired ion beam current and ion beam composition.

According to a third embodiment, an ion source is disclosed, comprising an ion generator disposed in an ion source chamber for the generation of ions; a heat sink; a gas fillable chamber, disposed between and in thermal communication with the ion source chamber and the heat sink; a gas source in communication with the gas fillable chamber; and a vacuum pump in communication with the gas fillable chamber, wherein the gas source and the vacuum pump regulate a pressure of gas contained within the gas fillable chamber.

BRIEF DESCRIPTION OF THE FIGURES

For a better understanding of the present disclosure, reference is made to the accompanying drawings, which are incorporated herein by reference and in which.

DETAILED DESCRIPTION

Figure 2:
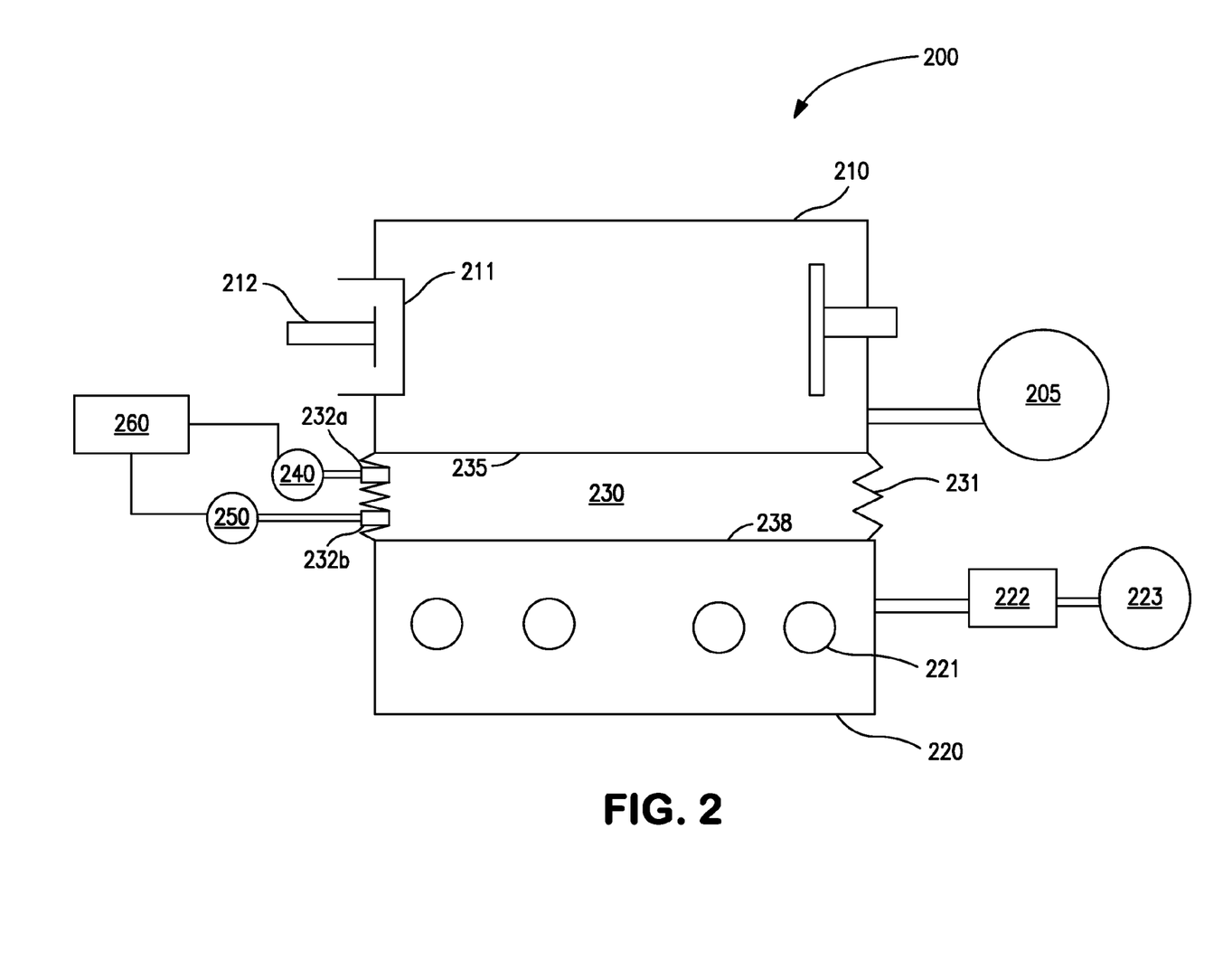
FIG. 2 shows an ion source according to a first embodiment.

FIG. 2 shows a representative ion source that may be used in accordance with one embodiment. In this system, there is an ion source 200, which is in communication with a feed gas source 205. Feed gas is supplied to the ion source 200 from a feed gas source 205. The feed gas may be any suitable gas. For example, in some embodiments, a boron-containing gas, such as $BF_3$ or diborane, may be used. In other embodiments, a phosphorus containing gas, such as $PH_3$, may be used.

In one embodiment, the ion source 200 may include an ion generator housed within an ion source chamber 210. This ion generator may be an indirectly heated cathode (IHC) 211 and a filament 212. Other devices may also be used to create the desired ions, including an RF antenna. This ion source 200 may be contained within a larger housing (not shown). As the ion source 200 is typically biased at a substantial voltage, it may be necessary to electrically isolate the ion source 200 from the housing. This may be achieved through the use of source bushings.

Also contained within the ion source 200 may be a heat sink 220. This heat sink 220 may be a thermal conductive material, such as aluminum, copper or any other suitable material. This heat sink may be at the same bias voltage as the ion source chamber 210. To increase the thermal capacity of the heat sink 220, one or more fluid channels 221 may be disposed within the heat sink 220. Outside the heat sink 220 may be a fluid source 223 and a pump 222 to continuously pass fluid through the fluid channels 221 within the heat sink 220. The fluid may be any suitable fluid, including gasses or liquids. For example, in some embodiments, water is used due to its high specific heat. However, other fluids may also be used, including, but not limited to, oils, engineered heat transfer fluids (such as, for example, Fluorinert™, Galden™, any of the Novec™ fluids, or other suitable fluids), hydrocarbons, fluorocarbons, alcohols, or others. The use of water, for example, may allow the heat sink 220 to be maintained at any temperature between 0° and 100° C., or higher if steam is utilized. The temperature of the heat sink 220 may be controlled using open loop control, wherein the flow rate of the fluid through the fluid channels 221 is maintained at a predetermined level. This level may be constant, or may be determined based on the energy supplied to the filament 212. In another embodiment, the temperature of the heat sink 220 may be controlled using closed loop control. In this embodiment, a temperature sensor (not shown) may be installed on or near the heat sink 220, or on or near the ion source chamber 210, so as to monitor its temperature. The temperature sensor may be in communication with a controller, which receives the input from the temperature sensor and varies the flow through the fluid channels 221 by modulating the pump 222.

Disposed between the ion source chamber 210 and the heat sink 220 is a gas fillable chamber 230. This gas fillable chamber comprises sidewalls 231 that connect between the ion source chamber 210 and the heat sink 220. This connection could be made in a number of ways, including welding or brazing; a bolted connection with a high temperature seal; or may be made from a solid piece, either machined or 3-D printed. These sidewalls 231 may be constructed of a material having a very low thermal conductivity, such as ceramic, titanium, or another suitable material. In some embodiments, the sidewalls 231 are shaped so as to increase their length, thereby further lowering their thermal conductivity. For example, the sidewalls 231 may be accordion or baffle shaped. In some embodiments, the sidewalls 231 may be made extremely thin, such as less than 1 mm. This thinness further lowers the heat transfer of these sidewalls 231. These features of the sidewalls 231 are all intended to minimize the conduction of heat from the ion source chamber 210 to the heat sink 220, through the sidewalls 231.

In some embodiments, one or more ports 232 may be disposed in the sidewalls 231 of the gas fillable chamber 230. For example, at least one port may be a gas inlet port 232a, where a gas is pumped into the gas fillable chamber 230. A second port may be a vacuum port 232b to exhaust gas from within the gas fillable chamber 230. In some embodiments, a single port 232 might be used for both inlet and exhaust. The gas inlet port 232a may be in communication with a gas source 240, which supplies the gas used to fill the gas fillable chamber 230. The vacuum port 232b may be in communication with a vacuum pump 250, used to evacuate the gas fillable chamber 230. It is noted that while one vacuum pump 250 is shown, multiple pumps may be used if necessary to achieve the required internal pressures in the gas fillable chamber 230. In this way, the gas fillable chamber 230 may be maintained at any desired pressure. A controller 260 may be in communication with both the gas source 240 and the vacuum pump 250 to regulate the pressure within the gas fillable chamber 230.

In some embodiments, the first endwall 235 of the gas fillable chamber 230 is part of the ion source chamber 210. In other words, the sidewalls 231 are affixed directly to one side of the ion source chamber 210, and this side of the ion source chamber 210 serves as first endwall 235. In another embodiment, the first endwall 235 may be constructed of a thermally conductive material, such as copper, tungsten or aluminum. This first endwall 235 is then placed in thermal communication with the ion source chamber 210. This may be done using a thermal adhesive or paste, a deformable or compressible thermally conductive sheet, an additional gas or liquid layer, or any other means known in the art.

In some embodiments, the second endwall 238 of the gas fillable chamber 230 is part of the heat sink 220. In other words, the sidewalls 231 may be affixed directly to one side or surface of the heat sink 220, and this side of the heat sink 220 serves as second endwall 235. In another embodiment, the second endwall 238 may be constructed of a thermally conductive material. In this embodiment, the second endwall 238 may be thermally affixed to the heat sink 220, such as through the use of thermal adhesive adhesive or paste, a deformable or compressible thermally conductive sheet, an additional gas or liquid layer, or any other means known in the art.

Figure 3:
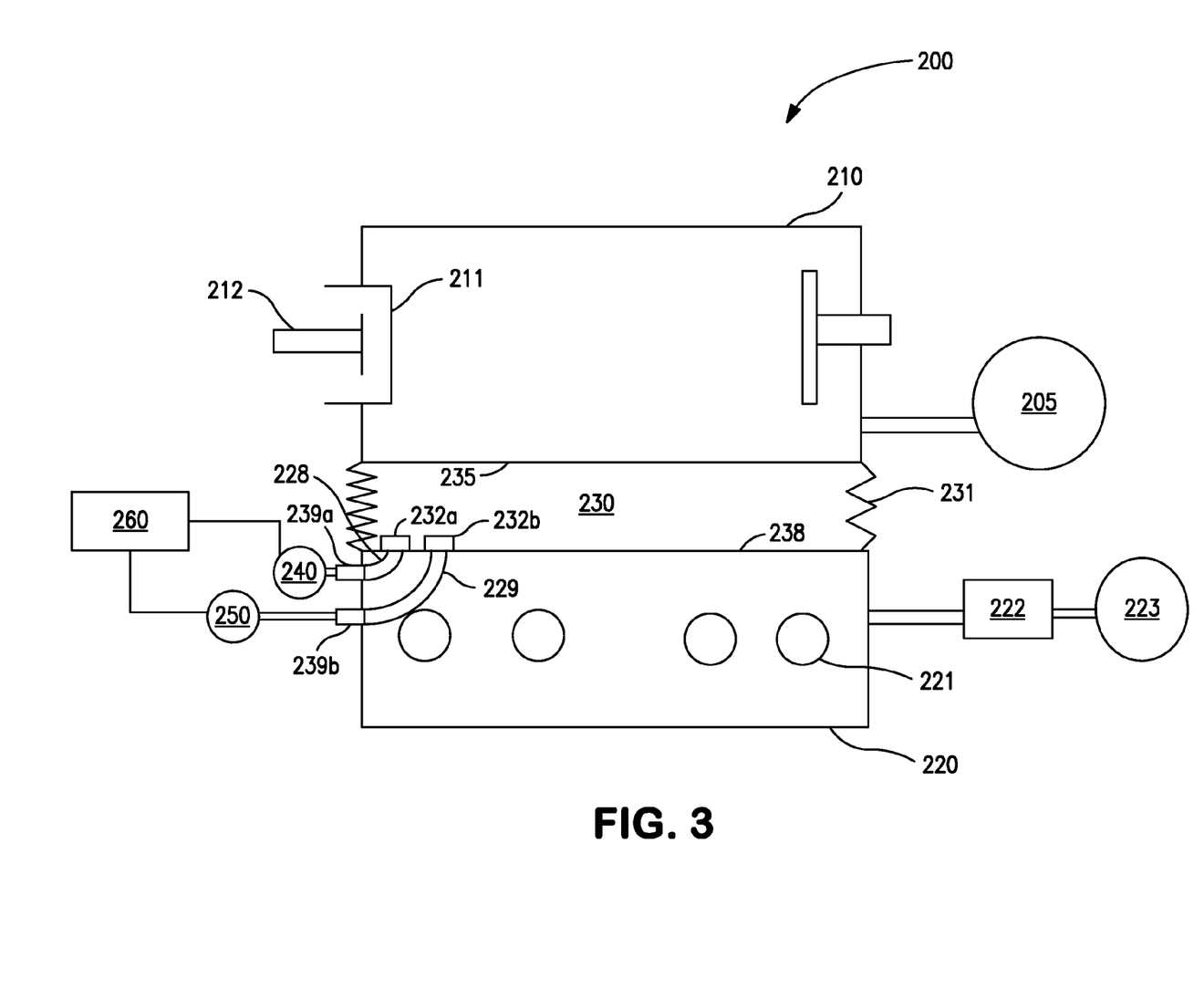
FIG. 3 shows an ion source according to a second embodiment.
Figure 7:
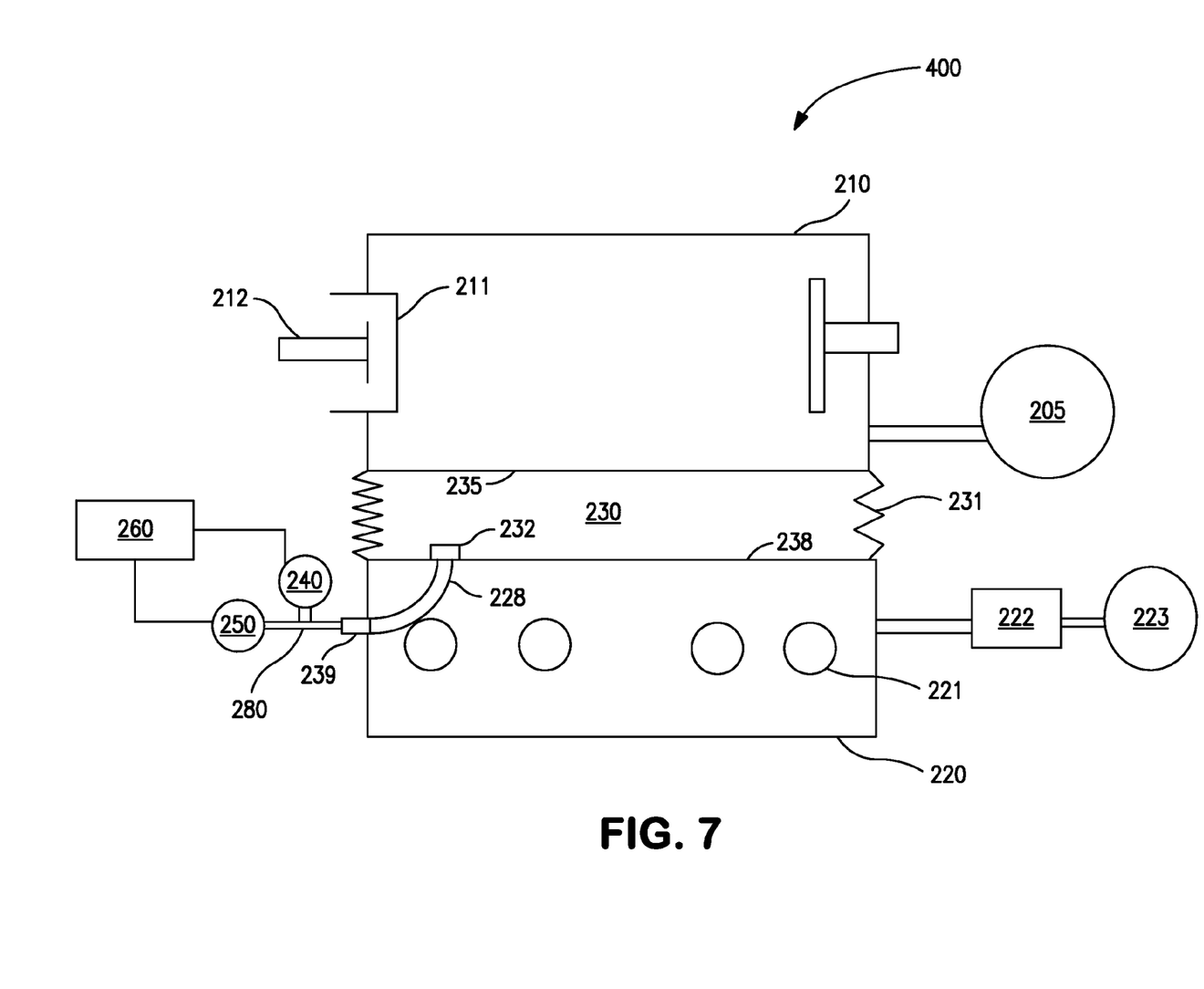
FIG. 7 shows an ion source according to a third embodiment.

Although ports 232 were previously described as being disposed in the sidewalls 231, other embodiments are possible. For example, in another embodiment, shown in FIG. 3, these ports 232 may be disposed in the heat sink 220. In FIG. 3, the ports 232 are connected through the heat sink 220. Other components are as described with respect to FIG. 2 and therefore will not be described again. In FIG. 3, the gas inlet port 232a and vacuum port 232b may be disposed on the second endwall 238, which is in communication with the interior of the gas fillable chamber 230. In this embodiment, a second set of ports 239a, 239b are disposed on a second surface of the heat sink 220 and is in communication with the gas inlet 232a and vacuum port 232b, respectively. In this embodiment, the gas source 240 is in communication with port 239a, while the vacuum pump 250 is in communication with port 239b. Gas passes from the gas source 240, to the port 239a, through a first passageway 228 in the heat sink 220 and to the gas inlet 232a. Likewise, gas within the gas fillable chamber 230 can be exhausted by drawing it through the vacuum port 232b, through a second passageway 229 in the heat sink 220 to port 239b. In some embodiments, such as is shown in FIG. 7, these two ports 239a, 239b may be the same port 239. In this embodiment, a single passageway 228 exists in the heat sink 220, terminating at port 232. A gas source 240 and a vacuum pump 250 may be plumbed appropriately externally to the gas fillable chamber 230, such as using a T-connection 280 and associated valves (not shown). In some cases, this may be done due to physical space limits.

In yet another embodiment, the ports 232, 239 may be disposed on the ion source chamber 210 proximate the first endwall 235. In this embodiment, the gas source 240 and vacuum pump 250 are in communication with ports 239a, 239b, respectively, which are disposed on another surface of the ion source chamber 210.

In some embodiments, the distance between the ion source chamber 210 and the heat sink 220 may be about 1 millimeter, although other separation distances are also possible.

The gas source 240 may contain any suitable gas. In some embodiments, a gas having a fairly high specific heat capacity or a fairly high thermal conductivity is used. For example, in some embodiments, helium, hydrogen, argon, nitrogen, sulphur hexafluoride, nitrous oxide or steam may be used, although other gasses may also be utilized.

Figure 4:
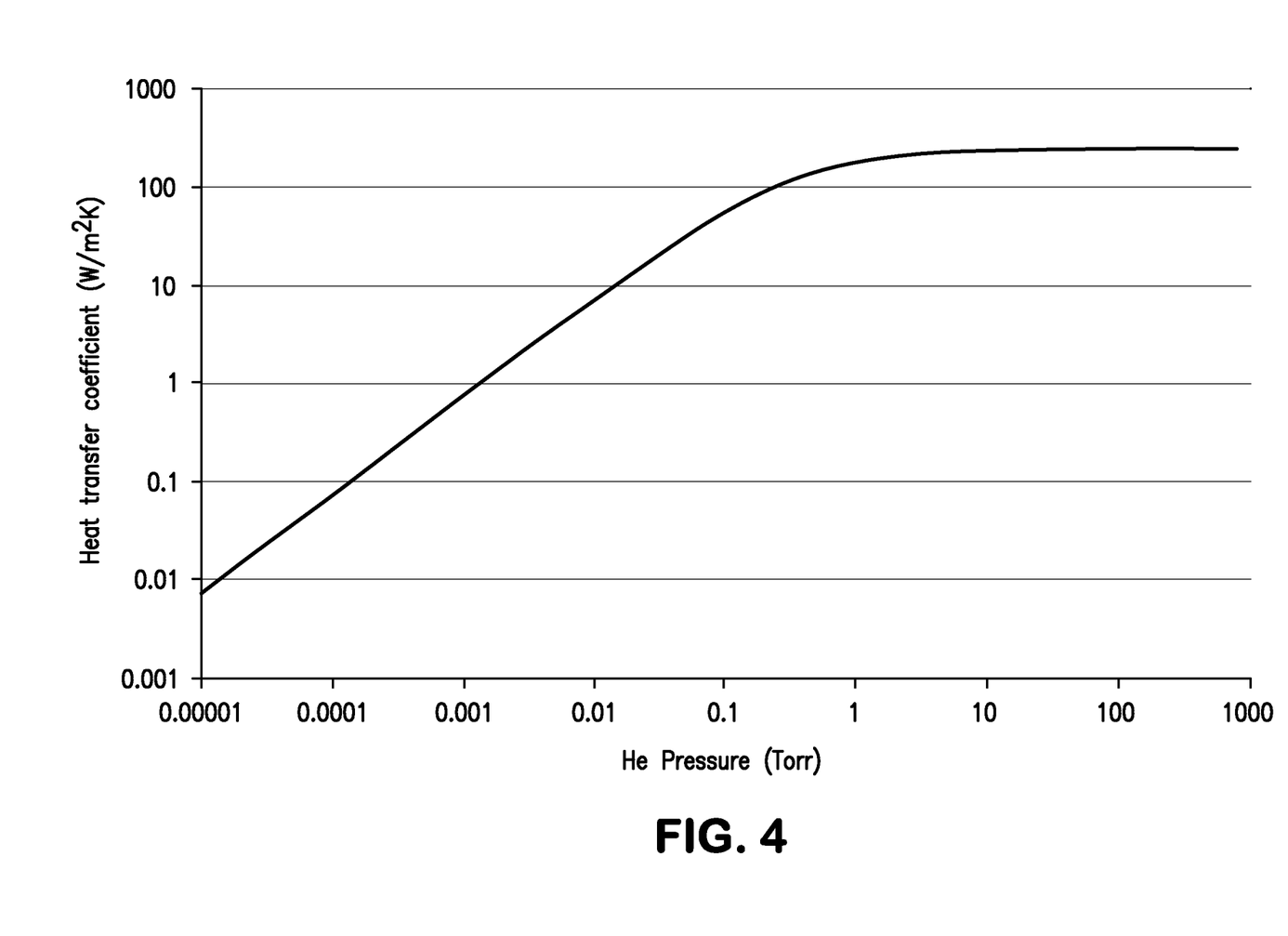
FIG. 4 shows a graph showing the heat transfer coefficient of helium in a 1 mm gap as a function of pressure in that gap.

The gas in the gas fillable chamber 230 can be maintained at any desired pressure, such as between 10 milliTorr and 760 Torr (or even a broader range). The heat transfer coefficient of the gas varies with pressure, as shown in FIG. 4. FIG. 4 shows the heat transfer coefficient as a function of the pressure. This graph shows the heat transfer coefficient of helium in a one millimeter gap. However, other gasses show similar trends. Based on FIG. 4, it is clear that more heat can be transferred from the ion source chamber 210 to the heat sink 220 when the pressure in the gas fillable chamber 230 is high. Similar, the amount of heat transferred is low when the pressure within the gas fillable chamber 230 is low. As shown in FIG. 4, the heat transfer coefficient can vary by 4 orders of magnitude as the pressure varies from 0.00001 Torr to 1 Torr. Thus, the magnitude of heat transfer between the ion source chamber 210 and the heat sink 220 can be regulated by varying the pressure within the gas fillable chamber 230. If the sidewalls 231 are poor thermal conductors, then the gas within the gas fillable chamber 230 may be the primary heat transfer mechanism between the ion source chamber 210 and the heat sink 220.

Thus, since the heat transfer coefficient of the gas fillable chamber 230 can be controlled, the temperature of the ion source chamber 210 can likewise be controlled.

To better understand this phenomenon, in steady state, consider that an amount of power, $P_{applied}$ is applied to the ion generator in the ion source chamber 210, through the various source power supplies, to create the plasma. This power is dissipated in various ways. First, some power, $P_{sidewall}$, is transferred by conduction through the sidewalls 231 from the ion source chamber 210 to the heat sink 220. Second, some power, $P_{gas}$, is transferred by the gas in the gas fillable chamber 230 from the ion source chamber 210 to the heat sink 220. Third, some power, $P_{bottom}$, is transferred through the bottom of the ion source chamber 210, from the first endwall 235 to the second endwall 238 through radiation. The first endwall 235 and the second endwall 238 might be treated in some way to lower their emissivities, to reduce the radiated heat transfer between these two surfaces. This lost heat is referred to as $P_{bottom}$. Fourth, some power, $P_{rad}$, is transferred, also via radiation, through the other sides of the ion source chamber 210.

Figure 5:
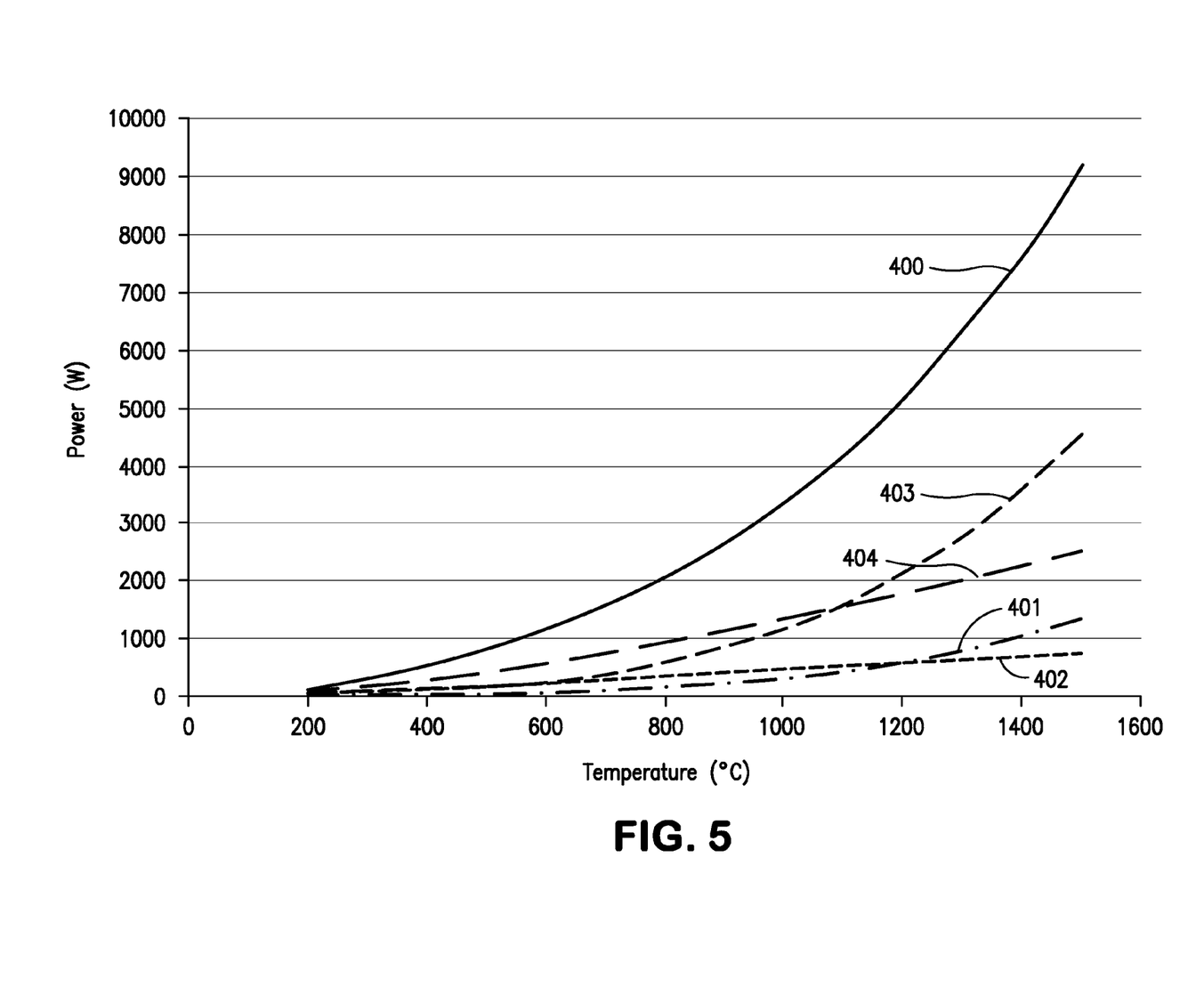
FIG. 5 shows a graph representing the distribution of power when the gas fillable chamber is filled to a first pressure.

Several of these power dissipation paths, specifically $P_{bottom}$, $P_{sidewall}$ and $P_{rad}$, are relatively predictable as a function of the power applied ($P_{applied}$) to the filament 212. However, one heat dissipation path, $P_{gas}$, can be varied by regulating the pressure within the gas fillable chamber 230. Changing the gas pressure changes the power loss, $P_{gas}$. This, in turn, changes the total power loss, and thus changes the steady state temperature of the ion source chamber 210. For example, FIG. 5 shows a first graph, where the gas in the gas fillable chamber 230 is maintained at about 1 atm. Line 400 represents the power applied to the filament 212 ($P_{applied}$), while lines 401, 402 and 403, represent $P_{bottom}$, $P_{sidewall}$ and $P_{rad}$, respectively. As can be seen, line 401 shows that as more power is applied to the ion generator in the ion source chamber 210, the heat dissipated by the bottom of the ion source chamber 201 that is not conducted by the gas filled chamber 230 increases slightly. However, the bottom of the ion source chamber 201 is only able to dissipate about 400 W, even when the ion source chamber 210 is at 1000° C. Similarly, if the sidewalls 231 are thermally non-conductive, as described above, the total power dissipated through these sidewalls, $P_{sidewall}$ as shown in line 402, is only about 500 W, even when the ion source chamber 210 is at 1000° C. In addition, the radiation from the other sides of the ion source chamber 210, $P_{rad}$, as seen in line 403, reaches about 1500 W when the ion source chamber 210 reaches 1000° C. The power transferred by the gas in the gas filled chamber 230 is represented by line 404. As seen in FIG. 5, when the ion source chamber 210 is at 1000° C., about 1300 W are dissipated via the gas in the gas filled chamber 230. These heat dissipation paths, specifically 401, 402, 403, and 404, all serve to reduce the temperature of the ion source chamber 210 by dissipating different amounts of power. In this example, if 2500 W is used to heat the filament 212, the ion source chamber 210 may reach about 800° C., as shown by line 400. Similarly, if 1000 W is used to heat the filament 212, the ion source chamber 210 may reach about 500° C.

Figure 6:
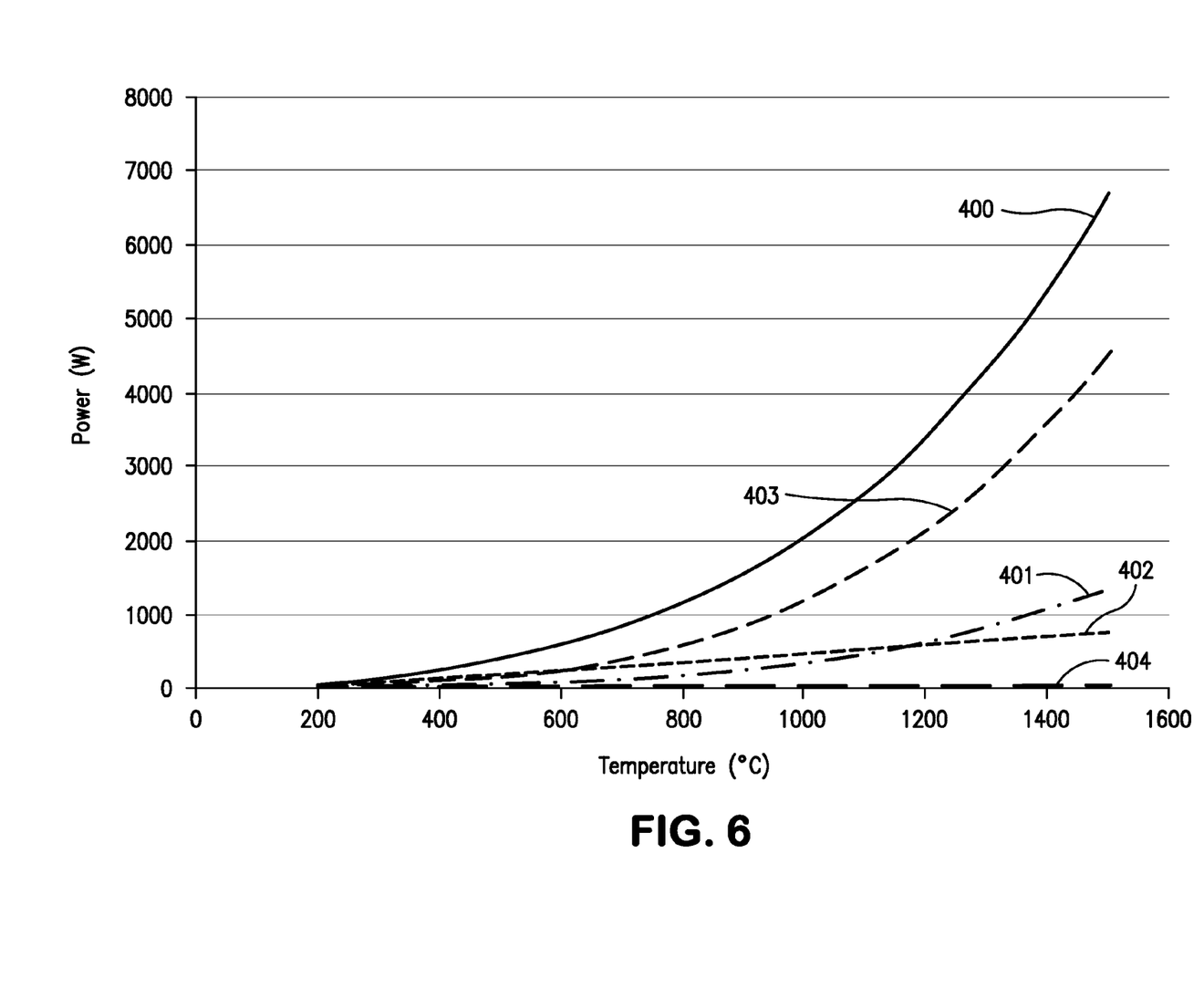
FIG. 6 shows a graph representing the distribution of power when the gas fillable chamber is filled to a second pressure.

FIG. 6 shows a second graph, in which the gas in the gas fillable chamber 230 is maintained at about 10 milliTorr. The lines on the graph are as described with respect to FIG. 5. Note that the lines 401, 402, 403 are unchanged from FIG. 5. This is because these heat conduction paths are unaffected by the amount of gas in the gas filled chamber 230. However, line 404 is changed significantly because the decrease in pressure in the gas filled chamber. In this graph, almost no heat is conducted by the gas ($P_{gas}$), regardless of the temperature of the ion source chamber 210. Thus, the heat that was previously removed by the gas in FIG. 5 now remains in the ion source 210. Thus, the temperature of the ion source chamber 210 is higher at a particular power level than it was in the configuration shown in FIG. 5. For example, if 2500 W is used to power the ion generator, the ion source chamber 210 may reach about 1000° C., as shown by line 400. Similarly, if 1000 W is used to power the ion generator, the ion source chamber 210 may reach about 700° C. In other words, in this example, for a given input power, the temperature of the ion source chamber can be varied by about 200° C., depending on the pressure of the gas within the gas filled chamber 230.

Stated differently, assume that, to produce the desired ion species, the temperature of the ion source chamber 210 cannot exceed, for example, 700° C. When there is almost no gas in the gas filled chamber 230 (which may approximate current ion sources), about 1000 W may be applied to the ion generator, as seen in FIG. 6. However, by maintaining about 1 atm in the gas filled chamber 230, about 1700 W may be applied to the ion generator, while keeping the ion source chamber 210 at 700° C., as shown in FIG. 5.

In another embodiment, different ion species can be generated using the same applied power ($P_{applied}$) by regulating the amount of gas in the gas filled chamber 230. For example, the pressure with the gas filled chamber 230 may be maintained at 1 atm to generate larger or molecular ions at a given $P_{applied}$. By reducing the pressure with the gas filled chamber 230 to a lower value, such as 10 millitorr, smaller or atomic ions may be created using the same $P_{applied}$. As an example, to create molecular ions, such as $BF_2^+$ or borane, it may be desirable to maintain a lower temperature of the ion source chamber 210. However, for source gasses, such as phosphine and arsine, it may be desirable to maintain a high temperature in the ion source chamber 210 to facilitate the formation of multi-charged atomic ions.

The gas filled chamber 230 may also allow the ion source chamber 210 to reach steady state temperature more quickly, thereby increasing the operational uptime of the system. This may reduce ion beam tune time. For example, during normal operation, the ion source chamber 210 may need to be at or above a certain temperature. To reach this temperature quickly, the pressure within the gas filled chamber 230 may be kept very low. Once the desired temperature is reached, gas is pumped into the gas filled chamber 230, thereby maintaining the ion source chamber 210 at the desired temperature.

The pressure within the gas filled chamber 230 may be controlled in a number of ways.

In one embodiment, open loop control may be used. Empirical testing may be done to determine the appropriate pressure for each combination of feed gas, desired ion species, and applied power ($P_{applied}$). In this embodiment, the controller 260 may include a table or algorithm that utilizes feed gas, desired ion species and $P_{applied}$ as inputs, and determines the required pressure in the gas filled chamber 230.

In another embodiment, closed loop control may be used. For example, in one embodiment, a temperature sensor (not shown) may be disposed on the ion source chamber 210. The controller 260 uses the information concerning the feed gas and desired ion species to determine a desired temperature for the ion source chamber 210. The controller 260 then uses the input from the temperature sensor to regulate the pressure within the gas filled chamber 230 to maintain this desired temperature. As described above, the pressure within the gas filled chamber 230 may be maintained by the controller 260 through adjustment of the gas source 240 and vacuum pump 250. In some embodiments, in addition to regulating the pressure within the gas fillable chamber 230, the controller 260 may also regulate the temperature of the heat sink 220, as described above.

In another embodiment, the controller 260 may use a parameter associated with the ion beam to regulate the pressure within the gas filled chamber 230. An ion beam detector (not shown) may be utilized to measure a parameter associated with the ion beam extracted from the ion source chamber 210. For example, the ion content of the beam extracted from the ion source 200 may be determined by the ion beam detector. This ion content can then be analyzed by the controller 260 to regulate the pressure in the gas filled chamber 230. For example, if the extracted ion beam contains a large number of atomic boron ions, and $BF_2^+$ ions are desired, the controller 260 may increase the pressure in the gas filled chamber 230 to reduce the temperature of the ion source chamber 210. Conversely, if more molecular ions are being extracted than desired, the controller 260 may decrease the pressure in the gas filled chamber 230 to increase the temperature of the ion source chamber 210. In another embodiment, the ion beam current may be monitored by the ion beam detector and the power applied to the ion generator in the ion source may be varied based on the monitored ion beam current. In yet a further embodiment, both ion beam current and ion beam composition are monitored, and both applied power and pressure are varied in response to the monitored parameters. Other parameters of the ion beam that may be monitored include, but are not limited to, ion beam current density, ion beam angle and angle distribution Thus, the present disclosure describes a system and method of regulating the temperature of an ion source by transferring a variable amount of heat away from the ion source chamber. In some embodiments, this regulation of temperature is at least partially independent of the power applied to the ion generator in the ion source chamber. In some embodiments, the system can select a power level to be applied to the ion generator in the ion source chamber to generate the desired ion beam current. Independently, the system can select temperature to maintain the ion source chamber at to generate the desired ion species. In one particular embodiment, the system may select a pressure at which to keep the gas fillable chamber to generate the desired ion species. Thus, two different tunable parameters may be used to generate an ion beam of a desired current and ion composition.

Thus, a system and method for generating an ion beam of a desired composition and beam current is disclosed. This system and method utilize two different mechanisms to control the extracted beam current and the species of ions that are generated. The mechanism for controlling extracted beam current is based on the power applied to the ion generator in the ion source chamber. The mechanism for controlling the species of ions that are generated may be temperature regulator in communication with the ion source chamber. The temperature regulator may control the amount of heat that is transferred away from the ion source chamber. A controller may be used to control the power applied to the ion generator and regulate the temperature of the ion source chamber. Both open loop and closed loop control system may be employed to maintain the desired ion beam current and composition.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of producing an ion beam having a desired beam current and a desired ion composition, comprising:
   introducing a feed gas to an ion source chamber;
   applying power to an ion generator disposed in said ion source chamber to create a plasma having said desired beam current; and
   independently controlling a temperature of said ion source chamber by transferring a variable amount of heat away from said ion source chamber to create said ion beam of said desired ion composition, wherein the independently controlling the temperature of said ion source comprises:
   providing a heat sink
   providing a gas fillable chamber between and in thermal communication with said ion source chamber and said heat sink; and
   controlling pressure in the gas fillable chamber with a vacuum pump.

2. The method of claim 1, further comprising a heat sink and a gas fillable chamber disposed between and in thermal communication with said ion source and said heat sink, wherein said controlling said temperature is performed by regulating a pressure of gas within said gas fillable chamber.

3. The method of claim 1, wherein a parameter of said ion beam is monitored, and said temperature is regulated based on said monitored parameter.

4. The method of claim 3, wherein said parameter comprises one or more selected from the group consisting of ion beam composition, ion beam current, ion beam current density, ion beam angle and angle distribution.

5. The method of claim 1, wherein a parameter of said ion beam is monitored, and said power applied to said ion source chamber is regulated based on said monitored parameter.

6. The method of claim 5, wherein said parameter comprises one or more selected from the group consisting of ion beam composition, ion beam current, ion beam current density, ion beam angle and angle distribution.

7. The method of claim 1, wherein said controlling said temperature comprising regulating the conduction of heat away from said ion source chamber.

8. An ion source, comprising:
   an ion generator disposed within an ion source chamber for the generation of ions;
   a temperature regulator in thermal communication with said ion source chamber to regulate a temperature of said ion source chamber by transferring a variable amount of heat away from said ion source chamber; and
   a controller in communication with said temperature regulator and said ion source chamber, so as to control power applied to said ion generator in said ion source chamber and said temperature of said ion source chamber, based on a desired ion beam current and ion beam composition, wherein the temperature regulator comprises a heat sink;
   a gas fillable chamber, disposed between and in thermal communication with said ion source chamber and said heat sink;
   a gas source in communication with said gas fillable chamber; and
   a vacuum pump in communication with said gas fillable chamber, wherein said gas source and said vacuum pump regulate a pressure of gas contained within said gas fillable chamber.

9. The ion source of claim 8, further comprising an ion beam detector in a path of an ion beam extracted from said ion source chamber.

10. The ion source of claim 9, wherein said controller monitors a parameter of said extracted ion beam using said ion beam detector and regulates said power applied to said ion generator and said temperature of said ion source chamber based on said monitored parameter.

11. The ion source of claim 10, wherein said parameter comprises one or more selected from the group consisting of ion beam composition, ion beam current, ion beam current density, ion beam angle and angle distribution.

12. The ion source of claim 8, further comprising a temperature sensor disposed in thermal communication with said ion source chamber, wherein said controller monitors said temperature of said ion source chamber using said temperature sensor.

13. An ion source, comprising:
   an ion generator disposed in an ion source chamber for the generation of ions;
   a heat sink;
   a gas fillable chamber, disposed between and in thermal communication with said ion source chamber and said heat sink;
   a gas source in communication with said gas fillable chamber; and
   a vacuum pump in communication with said gas fillable chamber, wherein said gas source and said vacuum pump regulate a pressure of gas contained within said gas fillable chamber.

14. The ion source of claim 13, further comprising an ion beam detector in a path of an ion beam extracted from said ion source chamber.

15. The ion source of claim 14, further comprising a controller, wherein said controller monitors a parameter of said extracted ion beam using said ion beam detector and regulates said pressure of gas in said gas fillable chamber based on said parameter.

16. The ion source of claim 15, wherein said parameter comprises one or more selected from the group consisting of ion beam composition, ion beam current, ion beam current density, ion beam angle and angle distribution.

17. The ion source of claim 13, further comprising a temperature sensor disposed in thermal communication with said ion source chamber, and a controller, wherein said controller monitors a temperature of said ion source chamber using said temperature sensor and regulates said pressure of gas in said gas fillable chamber based on said temperature.

18. The ion source of claim 13, wherein said controller regulates said pressure of gas in said gas fillable chamber based on desired species of said ions extracted from said ion source chamber.

* * * * *